United States Patent

[11] 3,584,242

[72] Inventor Takashi Fujita
Toyonaka-shi, Japan
[21] Appl. No. 787,102
[22] Filed Dec. 26, 1968
[45] Patented June 8, 1971
[73] Assignee Matsushita Electric Industrial Co., Ltd.
Kadoma-shi, Osaka, Japan
[32] Priority January 16, 1968
[33] Japan
[31] 43/2959

[54] PHASE-CONTROLLED PULSE GENERATOR
5 Claims, 3 Drawing Figs.

[52] U.S. Cl. .......... 307/308, 307/295, 307/297, 307/324, 307/252B, 307/252N, 307/262
[51] Int. Cl. .......... H03k 17/68, H03k 17/70
[50] Field of Search .......... 307/262, 305 A, 252, 295, 297, 308

[56] References Cited
UNITED STATES PATENTS

| | | | |
|---|---|---|---|
| 2,939,064 | 5/1960 | Momberg | 307/252 |
| 3,131,545 | 5/1964 | Gross et al. | 307/252 |
| 3,244,965 | 4/1966 | Gutzwiller | 307/262 |
| 3,346,874 | 10/1967 | Howell | 307/305 |
| 3,377,528 | 4/1968 | Toussaint et al. | 307/308 |
| 3,444,444 | 5/1969 | Yamashiti et al. | 307/308 |

OTHER REFERENCES

GE. Application Note, " Triac Control for AC Power," pages 1— 7, May 1964

*Primary Examiner*—Donald D. Forrer
*Assistant Examiner*—Harold A. Dixon
*Attorney*—Stevens, Davis, Miller and Mosher

ABSTRACT: A phase controlled thyristor system having a shunt RC circuit including a laminate structure pressure sensitive, negative resistance device.

INVENTOR
TAKASHI FUJITA
BY Stevens, Davis, Miller & Mosher
ATTORNEYS

PHASE-CONTROLLED PULSE GENERATOR

This invention relates to a pulse generator, and more particularly it pertains to a phase-controlled pulse generator adapted to generate in synchronism with the circuit operation a pulse voltage which is required to energize an element or device capable of phase control such as thyristor or the like.

The device of the present invention is a composite element which is a combination of a semiconductor element or pressure-sensitive element of which the electrical resistance between electrodes is remarkably changed by imparting a pressure to the electrode surface, a semiconductor element representing a negative resistance region in the voltage-current characteristic thereof and a capacitor, wherein when a pressure is imparted to the pressure-sensitive element, the resistance of the latter is changed so that a charging current passing to the capacitor is controlled, thereby controlling the phase of a pulse voltage produced by the negative resistance element with respect to a power source.

The conventional phase-controlled pulse generator is constructed by mounting on a printed circuit board a variable resistor, a semiconductor element having a negative resistance, a capacitor, a resistor and so forth, and therefore it is disadvantageous in that it becomes relatively bulky.

In accordance with the present invention, the foregoing drawback of the conventional device can be eliminated. Therefore, it is an object of the present invention to provide a phase-controlled pulse generator wherein a capacitor is connected with a composite element consisting of a pressure-sensitive element formed by a semiconductor substrate containing an impurity which defines a deep level therein and a negative resistance element.

According to the present invention, there is provided a greatly miniaturized contactless pulse generator capable of phase control. By combining such device with a power control element such as a thyristor or the like, it is possible to control power supplied to a load. Thus the device according to the present invention is novel and has a great industrial utility.

The present invention will now be described in detail in conjunction with the accompanying drawings, in which.

Figure 1:
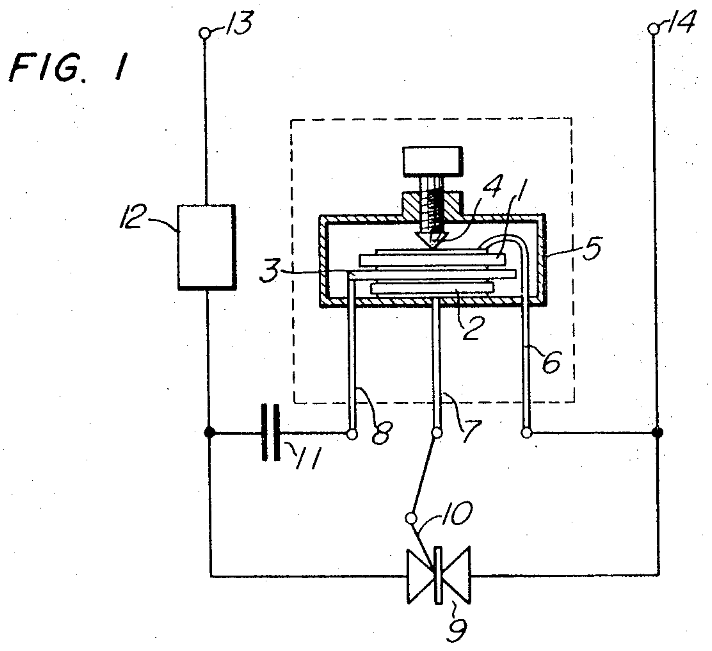
FIG. 1 is a diagrammatic view showing the electrical and mechanical arrangement of the phase-controlled pulse generator according to an embodiment of the present invention as applied to load control.
Figures 2, 3:
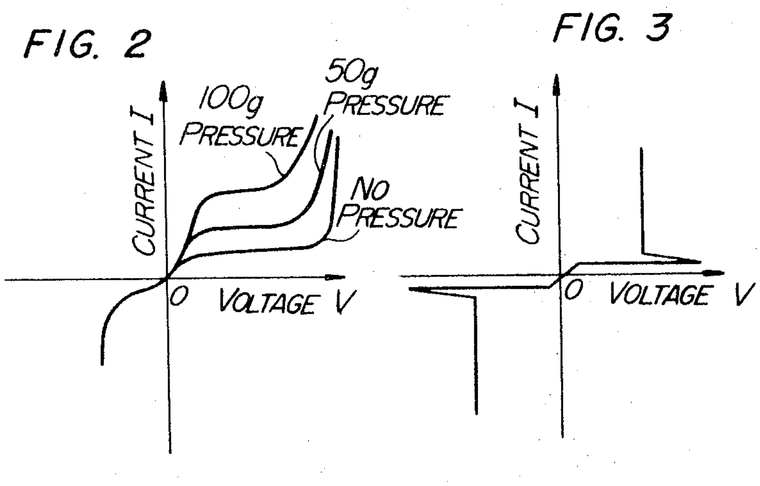
FIG. 2 is a view showing the voltage-current characteristic of a pressure-sensitive element used in the device shown in FIG. 1.
FIG. 3 is a view showing the voltage-current characteristic of a bidirectional negative resistance element used in said device.

Description will now be made of the embodiment shown in FIG. 1, wherein the reference numeral 1 represents a pressure resistance element or pressure-sensitive element constituted by a semiconductor substrate containing an impurity which defines a deep level. The element 1 has electrodes provided on the opposite surfaces, and the voltage-current characteristic thereof is such that a current flowing therethrough is varied with a pressure applied thereto as shown in FIG. 2. The reference numeral 2 denotes a semiconductor element representing a bidirectional negative resistance. The element 2 also has electrodes provided on the opposite surfaces, and the voltage-current characteristic thereof is as shown in FIG. 3, from which it will be seen that the element 2 is capable of producing switching action in accordance with a voltage applied thereto. The reference numeral 3 indicates a conductive baseplate interposed between the pressure-sensitive element 1 and the negative resistance element 2, and 4 means for imparting a pressure to the pressure-sensitive element 1. The means 4 is screwed into a casing 5 accommodating the pressure-sensitive element 1, negative resistance element and baseplate 3, so that by rotating the means 4, a pressure is applied to the pressure-sensitive element 1. The reference numeral 6 represents an output terminal connected with one of the electrodes of the pressure-sensitive element 1, 7 an output terminal connected with one of the electrodes of the negative resistance element 2, and 8 an output terminal connected with the baseplate 3 with which are contacted the other electrodes of the pressure-sensitive element 1 and negative resistance element 2. The reference numeral 9 indicates a power control element such as a thyristor or the like, 10 the gate terminal thereof, 11 a capacitor, 12 a load, and 13 and 14 AC power source terminals with which is connected the control element 9 through the load 12. The capacitor 11 is inserted between the connection point between the control element 9 and the load 12 and the terminal 8, the terminal 6 is connected with the power source terminal 14, and the gate terminal 10 of the control element 9 is coupled to the terminal 7.

The operation of the device will be described below.

By turning a thumb of the pressure imparting mechanism to cause the pressure imparting member 4 to impart a pressure to the pressure-sensitive element 1, the resistance of the semiconductor portion between the electrodes of the element 1 is decreased. Consider a current flowing through the pressure-sensitive element 1, capacitor 11 and load 12. When a power control element 9 is nonconductive, the power source voltage is applied between the element 1 and the load 12, so that the capacitor 11 is charged with a current flowing therethrough. In this case, since the capacitor 11 is connected with the power source through the pressure-sensitive element 1, the charging speed is varied with variations in the resistance of the pressure-sensitive element 1. In a closed circuit consisting of the negative resistance element 2—baseplate 3—terminal 8—capacitor 11—power control element 9—gate terminal 10—terminal 7, when the voltage charged at the capacitor 11 exceeds the breakover voltage of the negative resistance element 2, it is discharged so that there is produced a pulse by which the power control element 9 is rendered conductive. By repetition of such operation, the phase of the resulting pulses is changed to thereby control the conduction angle of the power control element 9. Consequently, the power supplied to the load 12 is controlled.

What I claim:

1. A phase-controlled pulse generator, comprising, a power supply; a laminated structure, including a bidirectional negative resistance element, a pressure-sensitive semiconductor substrate containing an impurity defining a deep-energy level therein, and a conductive plate disposed between said negative resistance element and said semiconductor substrate; a capacitor connected in series with said conductive plate and said power supply; and a load power control element having a gate terminal operatively connected to said negative resistance element.

2. A phase-controlled pulse generator as defined in claim 1, further comprising a case containing said laminated structure and screw means mounted thereon imparting a variable pressure to said semiconductor substrate.

3. A phase-controlled pulse generator as defined in claim 1, wherein said semiconductor substrate is operatively connected to said power supply.

4. A phase-controlled pulse generator, comprising, in combination, power supply terminals, a series circuit of a capacitor and a pressure-sensitive semiconductor containing an impurity which defines a deep energy level therein, said semiconductor changing its internal resistance with pressure applied thereto, said circuit being coupled across said terminals, negative resistance means responsive to a voltage across the capacitor, means for switching a load circuit current with a gating terminal responsive to the on-operation of said negative resistance means, and screw means for imparting a pressure to said pressure-sensitive semiconductor.

5. A phase-controlled switching pulse generator, comprising, in combination, power supply terminals; a laminated structure including terminal electrodes, a bidirectional negative resistance element disposed between said electrodes, an intermediate conductive plate thereon, and supporting electrodes having therebetween a pressure-sensitive semiconductor substrate which contains an impurity defining a deep energy level therein; a capacitor series combination with said conductive plate connected across said terminals; a load power control element with a gating terminal connected to the external terminal electrode on said negative resistance element, and pressure imparting screw means having a casing accommodating said structure and a screw mounted thereon to impart a variable pressure to the external terminal electrode in turn to said pressure sensitive substrate in order to control the conduction of said negative resistance element.